United States Patent
Narayanaswamy et al.

(10) Patent No.: US 7,466,576 B2
(45) Date of Patent: Dec. 16, 2008

(54) TECHNIQUE FOR CAM WIDTH EXPANSION USING AN EXTERNAL PRIORITY ENCODER

(75) Inventors: Santhosh Narayanaswamy, Karnataka (IN); Bryan D Sheffield, McKinney, TX (US); Robert J. Landers, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 11/617,771

(22) Filed: Dec. 29, 2006

(65) Prior Publication Data

US 2008/0158928 A1    Jul. 3, 2008

(51) Int. Cl.
*G11C 15/00* (2006.01)
(52) U.S. Cl. ............... 365/49; 365/63; 365/210
(58) Field of Classification Search ............ 365/49, 365/63, 210, 233, 149, 185.25, 185.09, 189.07, 365/189.09, 230.08, 189.05
See application file for complete search history.

(56) References Cited

U.S. PATENT DOCUMENTS

2005/0052889 A1* 3/2005 Radke ............... 365/49
2006/0152956 A1* 7/2006 Roth ................ 365/49

* cited by examiner

*Primary Examiner*—Dang T Nguyen
(74) *Attorney, Agent, or Firm*—Alan K. Stewart; W. James Brady; Frederick J. Telecky, Jr.

(57) ABSTRACT

A technique that provides width expansion of two CAMs of varying widths by combining match results from two CAMs by integrating the two CAMs. In one embodiment, a synchronizer circuit triggers the operation of an External Priority Encoder module which can be used to cascade two CAMs to form a wider CAM. When the External Priority Encoder module is used with the CAM, the External Priority Encoder module will receive MATCH signals and control signals from individual CAMs residing on either side, and will be triggered by the last arriving signal between two ports associated with two CAMs. In case one of the ports is disabled the External Priority Encoder module relies totally on the control signal from the other port for operation. The synchronizer circuit has the ability to handle mismatches between the CAMs as well as differentiating valid and invalid combinations between the CAMs.

11 Claims, 3 Drawing Sheets

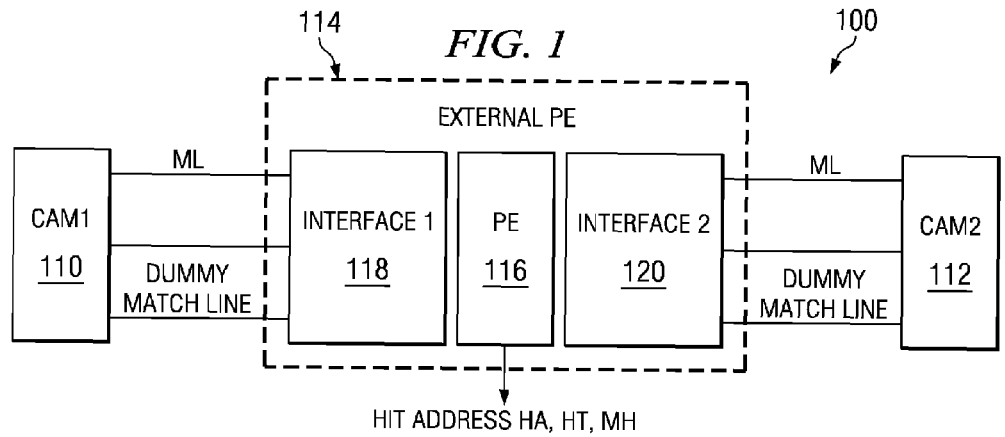
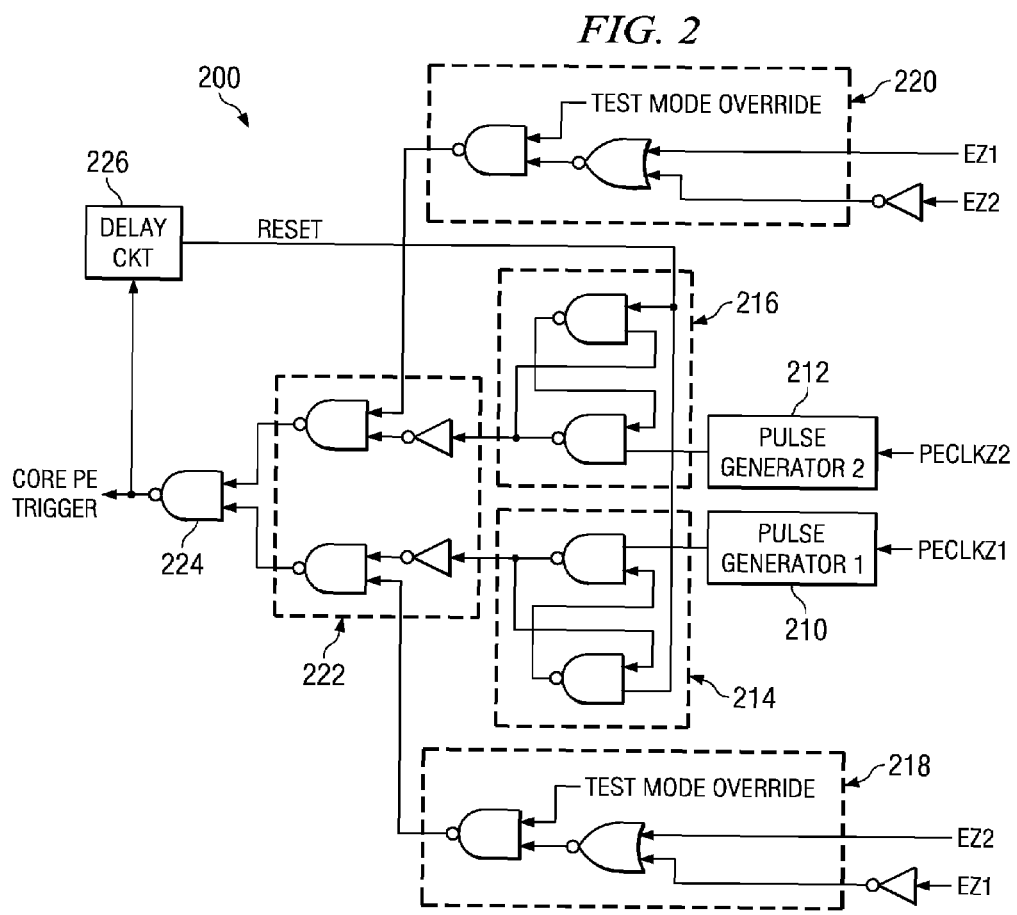

TECHNIQUE FOR CAM WIDTH EXPANSION USING AN EXTERNAL PRIORITY ENCODER

TECHNICAL FIELD OF THE INVENTION

The present invention relates generally to digital integrated circuits, and more particularly relates to a technique of CAM width expansion using an External Priority Encoder by combining the match results of two CAMs.

BACKGROUND OF THE INVENTION

Content addressable memory (CAM) is being increasingly used in search engines today. In addition to performing read and write operations, this type of memory accepts data as input and returns an address as its output. This is in contrast to the normal memory, which only takes an address as an input and returns data stored at that address as an output.

A CAM receives a data input or a data sample often termed a "word" (i.e., a plurality of bits or trits). The size of a CAM is not standard and in current usage it is often quite long. A typical CAM contains, among other logic blocks: a CAM array block, a match detection block, and a Priority Encoder block. The CAM array block contains CAM cells and comparison logic. The match detection block contains logic and sense amplifiers which determine if such a word being processed has any matches and produces a match signal for each content word compared against. The Priority Encoder block contains logic to process a set of match signals and to determine any matches of a received word are indicated, and to pick among all such matches to establish one as having priority according to a pre-established rule. The CAM then outputs the address of a highest priority match as a result output.

Larger CAMs are generally slow. Partitioning them into two separate CAMs and combining their match results in an External Priority Encoder can give a better performance than a single large CAM. However, this has posed many problems including synchronization of match information and control signals in the logic used for combining, ability to combine CAMs of different widths, combine match results while allowing just one or both CAMs enabled, or timing mismatches between the two CAMs.

The performance of a CAM is generally limited by its size. It is often necessary and useful to get a larger CAM, with more bits per word without losing performance. Other problems encountered in combining two CAMs are the ability to differentiate valid (e.g., both the CAMs in search mode) versus invalid (e.g., one CAM in read, and the other CAM in search mode) combinations without getting locked up.

SUMMARY OF THE INVENTION

According to an aspect of the present subject matter, there is provided a method and system for combining match results of two CAMs which includes a first content addressable memory (CAM) device, a second CAM device, a plurality of global match (ML) lines and a dummy match line and the associated outputs of each CAM device coupled to their associated plurality of ML lines, and dummy match lines. The system further includes an External Priority Encoder module housing an Interface Circuit for each of the first CAM device and the second CAM device and a Priority Encoder block in communicating relationship with each Interface Circuit. The Interface Circuit houses a synchronizer circuit and a plurality of latches wherein the synchronizer circuit combines and integrates the match results from the first CAM device and the second CAM device and triggers the operation of the External Priority Encoder module based on the latter arriving signal of the first CAM device and the second CAM device.

BRIEF DESCRIPTION OF THE DRAWINGS

FIG. 1 is a system level diagram of a CAM system which uses an External Priority Encoder module for width expansion according to an embodiment of the invention.

FIG. 2 is a circuit diagram of a synchronizer circuit to combine match results of two CAMs in the External Priority Encoder according to an embodiment of the invention.

DETAILED DESCRIPTION OF THE INVENTION

Figure 3:
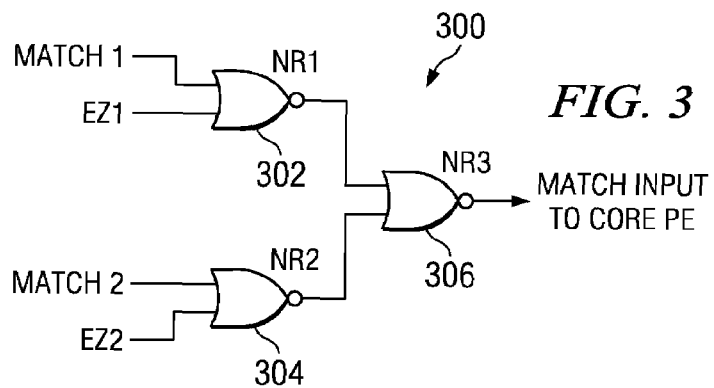
FIG. 3 is an example Interface circuit for combination of match information.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims. The terms "two CAMs" and "first CAM device and second CAM device" are used interchangeably throughout the document.

When two CAMs are integrated, it is possible that one of the CAMs is slower than the other, or just about the same, but it is generally not known which CAM is running faster. Therefore, when these two CAMs are integrated, a signal is required to tell the External Priority Encoder module that the data from the individual CAMs is ready, and to trigger the operation of the External Priority Encoder module and then get the hit address signal ready. Both the CAMs integrated in the system will send out the respective dummy match signals, so the synchronizer circuit checks the dummy match signals from the individual CAMs. As soon as the synchronizer circuit receives the first dummy match signal from either CAM, the synchronizer circuit sets into one particular state, and then upon receiving the second dummy match signal from the second CAM, the synchronizer circuit will trigger the operation. Basically, the synchronizer circuit will wait for the second arriving dummy match signal to trigger this internal operation, and will check if both CAMs are enabled or not. If one CAM is disabled the synchronizer circuit will understand that there is no dummy match signal coming from that CAM, and the synchronizer circuit will go ahead and trigger the operation of the Priority Encoder based on the dummy match signal of the enabled CAM alone.

Referring now to FIG. 1, there is described a system level block diagram 100 showing the two CAMs and an External Priority Encoder module. As shown in FIG. 1, the system level block diagram 100 includes a CAM1 corresponding to the first CAM device 110, a CAM2 corresponding to the second CAM device 112, and an External Priority Encoder module 114.

Each of the CAM1 and CAM2 blocks has an associated Interface circuit housed in the External Priority Encoder module 114. As shown, Interface1 118 and Interface2 120 are associated with CAM1 and CAM2 respectively. The Interface1 circuit 118 and the Interface2 circuit 120 include NOR gates and synchronizer circuitry to combine match information and control signals from both CAMs. The External Priority Encoder module 114 houses a Priority Encoder block 116 to receive MATCH and control signals from CAM1 and CAM2 residing on either side. The External Priority Encoder module 114 is triggered off the latest arriving signal between these two ports. The Priority Encoder block 116 as shown in FIG. 1 generates the signal HIT ADDRESS HA, HT, MH (HIT ADDRESS) which gives the priority address location of the match line ML where both the first and second CAMs have a match. In case one of the ports is disabled the External Priority Encoder module 114 relies totally on the control signal from the other port for operation. The External Priority Encoder module 114 and the CAMs will be operating in a pipelined fashion.

Referring now to FIG. 2, there is depicted a circuit diagram for the implementation of a synchronizer circuit to combine the match results of two CAMs in an External Priority Encoder. The control signals (enable signals) to the synchronizer circuit are EZ1 and EZ2. Two external clock signals PECLKZ1 and PECLKZ2 are control clocks from individual CAMs. The clocks PECLKZ1 and PECLKZ2 are falling edge clocks based on design specific implementation. A generic implementation can have any type of clock and logic adjustments. PECLKZ1 will be triggered if control signal EZ1 is enabled. Similarly, PECLKZ2 will be triggered if control signal EZ2 is enabled. If any control signal EZ is not enabled, the corresponding PECLKZ will not be triggered by the adjoining CAMs.

The different modes of operation of the CAM are described below and depicted in the wave form diagrams provided in the latter sections below. In normal mode, each of the control signals EZ1 and EZ2 can be enabled or disabled independently. During test mode both the CAMs are expected to be in operation, during such states both the CAMs will be active irrespective of their EZ states. During test mode, the synchronizer circuit 200 receives the test mode override signal. By override function, the synchronizer circuit looks for the occurrence of both PECLKZ1 and PECLKZ2 and the Priority Encoder is triggered based upon the latter arrival of the PECLKZ inputs.

The synchronizer circuit 200 in FIG. 2 consists of latches to capture signal information which are set by the PECLKZ1 and PECLKZ2 signals. If PECLKZ1 occurs first then the synchronizer circuit sets the corresponding latch. Whenever PECLKZ2 occurs later the synchronizer circuit sets the corresponding latch. When both latches are set the synchronizer circuit triggers a clock to the Priority Encoder block 116. This clock after some delay resets the latches on the PECLKZ1 and PECLKZ2. The dummy match signal from the individual CAM could come in the form of a pulse or in the form of a constant level signal. The pulse generation circuit 210 as shown in FIG. 2 receives an input clock signal PECLKZ1 and generates a pulse, and the pulse generation circuit 212 receives an input clock signal PECLKZ2 and generates a pulse. Further, as shown in FIG. 2, the first traveling pulse from Pulse Generator 1 210 sets the first SR latch as shown by the two back-to-back connected NAND gates 214, and when the second traveling pulse from Pulse Generator 2 212 arrives, the second SR latch is set which is represented by a second set of back-to back-connected NAND gates 216.

As shown in FIG. 2, the test mode override function is performed by the circuit shown as 218 corresponding to CAM1 (FIG. 1) and the circuit shown as 220 corresponding to the CAM2 (FIG. 1) respectively. The circuits 218 and 220 receive as inputs the control signals EZ1 and EZ2 and a Test Mode Override Signal, and the outputs of the circuit 218 and 220 are fed into a corresponding two input NAND gate.

Further, as shown in FIG.2, the circuit represented by 222 receives as inputs the outputs from the state machine circuits 214 and 216 and the outputs from circuit 218 and 220. The outputs of the circuit 222 are fed into a 2 input NAND gate 224 whose output is the Core PE Trigger signal which triggers the Priority Encoder block 116 housed in the External Priority Encoder module 114 (FIG. 1).

When both the SR latches 214 and 216 are set, the Core PE is triggered and the HA, HT, MH signal (FIG. 1) is generated. The Core PE trigger is delayed in the delay circuit 226 and the output is again fed back in to the latches that are triggered by the pulse generators.

Further, as shown in FIG. 2, if one of the enable signals is disabled the circuits 218 and 220 will come into operation. For example, when control signal EZ1 is disabled, then the latch output corresponding to PECLKZ1 is overridden to a logic high state. In this case the synchronizer circuit is triggered upon the occurrence of the PECLKZ2. When control signal EZ2 is disabled, the converse is true, the latch output corresponding to PECLKZ2 is overridden, and the second test mode override circuit in the block 218 enables the occurrence of PECLKZ1 to trigger the synchronizer circuit. If both the control signals EZ1 and EZ2 are disabled, then there is no effect of the clocks PECLK1 or PECLKZ2 and nothing happens.

Match information from individual CAMs will be available almost at the same time as the PECLKZ input is applied to the External Priority Encoder module 114. Match information from the individual CAMs is used depending upon the state of the EZ control signal inputs. When both the EZ control signal inputs are enabled, match information from both CAMs is used to generate the priority address. For a depiction of the relationship of the timing states of control signals EZ1 and EZ2 please refer to FIGS. 4 to 7 and its accompanying detailed description that follows.

The CAMS could be of different size depending on the application. This circuit waits for the slower CAM to finish its operation, and then triggers the External Priority Encoder operation, after the data is ready. This invention is used in combining two CAMs to build a CAM of wider width. The External Priority Encoder module 114 performs the function of combining the first and second match information and priority encoding operation.

Referring now to FIG. 3, there is described an Interface Circuit 300 for combination of match information. In the CAM combination, there could be one CAM which is disabled, in which case the match signal corresponding to the disabled CAM has no meaning and must be overridden. The circuit as shown in FIG. 3 is designed to mask the undesired output from the disabled CAM and supply only the match outputs of the enabled CAM. As shown, NR1 is a first NOR gate 302 whose inputs are the control signal EZ1 and MATCH 1 with an output signal (first signal). Similarly, NR2 is a second NOR gate 304 which receives as inputs EZ2 and MATCH 2 with an output signal (second signal). The outputs of NR1 302 and NR2 304 are the inputs to a third NOR gate NR3 306. If control signal EZ1 is high then the output of the first NOR gate NR1 302 is at a low value, in this case the final output at the NOR gate NR3 306 will only depend upon the match results of the EZ2 signals.

The same thing applies to match results of the EZ2 operation. If the second CAM CAM2 (FIG. 1) is disabled, control signal EZ2 is high, and the output of NR2 304 would be low, and the final output at the NOR gate NR3 306 will only depend on the match results of EZ1 in such a case. The final output of the Interface Circuit is shown as the Match Input to Core PE signal.

Figure 4:
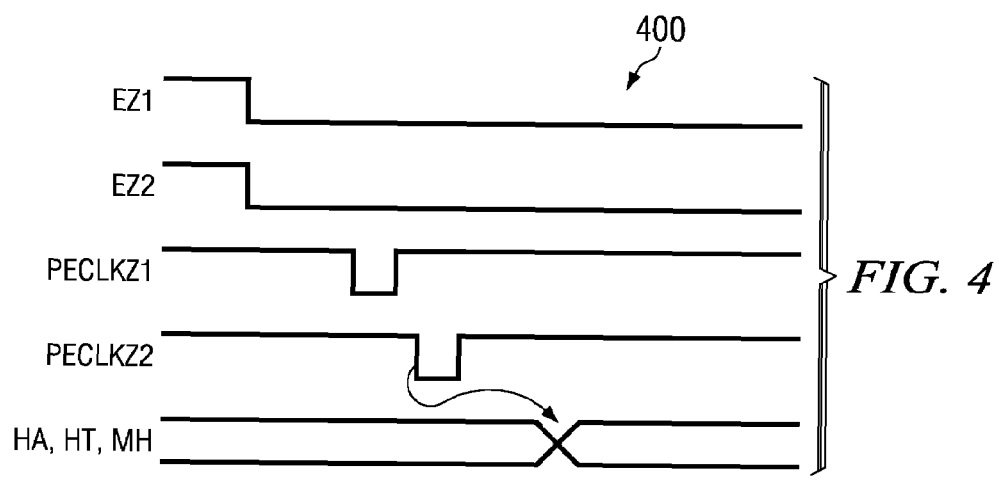
FIG. 4 is an example wave form diagram showing control signals to the synchronizer circuit EZ1 and EZ2 enabled.

Referring now to FIGS. 4 through 7, waveform diagrams are depicted showing timing relationships for different states of EZ1 and EZ2 signals in normal mode. The control signals EZ1 and EZ2 are enable signals corresponding to the clocks PECLKZ1 and PECLKZ2 respectively. In FIG. 4, there is described a wave form diagram showing input signals EZ1 and EZ2 enabled. In a normal mode, when both control signals EZ1 and EZ2 are enabled, internally the Priority Encoder operation is triggered at the falling edge of the latter of the PECLKZ1 and PECLKZ2. Please refer above sections for detail of the functioning of the Priority Encoder.

Figure 5:
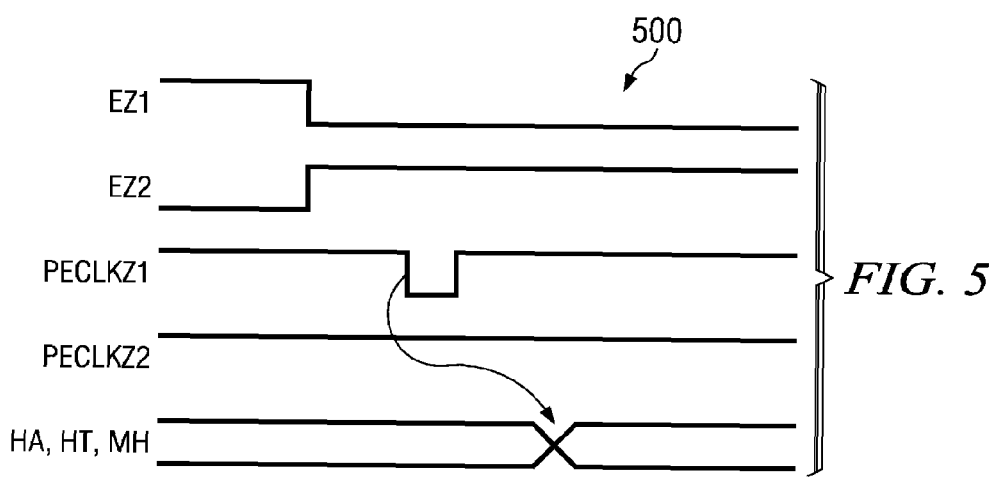
FIG. 5 is an example wave form diagram showing the control signals to the synchronizer circuit EZ1 enabled and EZ2 disabled.

Referring now to FIG. 5, there is described a wave form diagram showing input signals EZ1 enabled and EZ2 disabled. When one of the EZ input signals is disabled, internally, the Priority Encoder operation is triggered exclusively depending upon the PECLKZ of the enabled CAM, in this case control signal EZ1.

Figure 6:
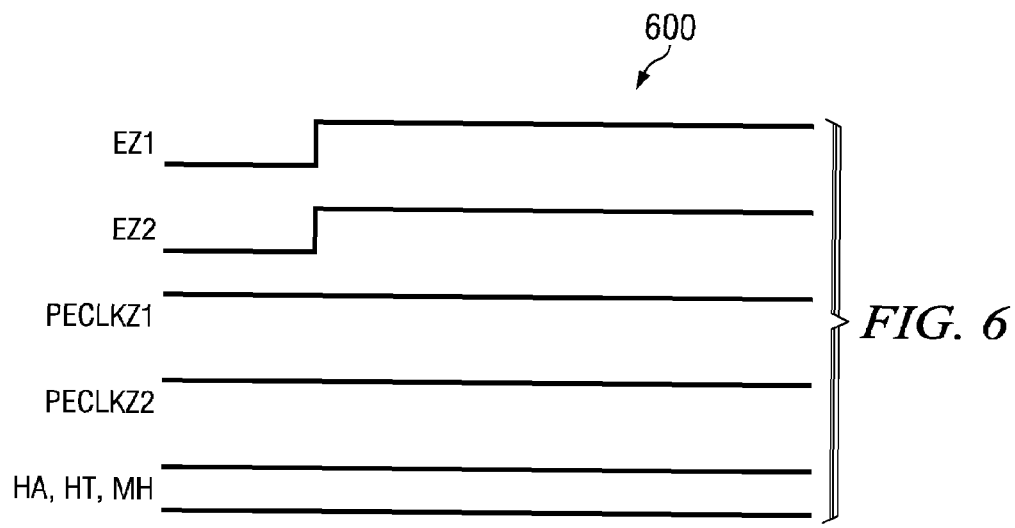
FIG. 6 is an example wave form diagram showing the control signals to the synchronizer circuit EZ1 and EZ2 disabled.

Referring now to FIG. 6, there is described a wave form diagram showing input signals EZ1 and EZ2 disabled. As seen in FIG. 6, when both EZ inputs are disabled, no PECLKZ is generated and hence there is no operation.

Figure 7:
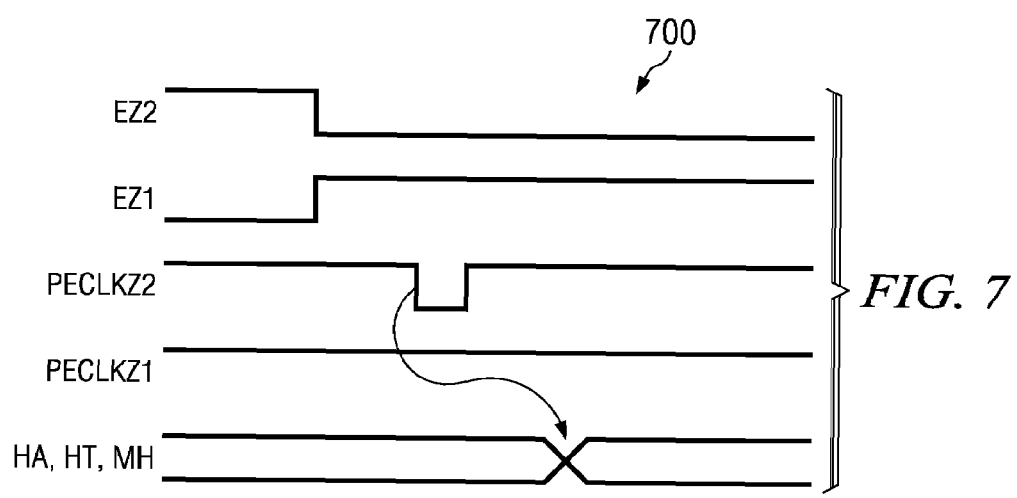
FIG. 7 is an example wave form diagram showing the control signals to the synchronizer circuit EZ1 disabled and EZ2 enabled.

Referring now to FIG. 7, there is described a wave form diagram showing input signals EZ1 disabled and EZ2 enabled. As in FIG. 7, when one of the EZ input signals is disabled, internally, the Priority Encoder Operation is triggered exclusively depending upon the PECLKZ of the enabled CAM, in this case input signal EZ2.

The above-described architecture provides a synchronizer circuit that provides width expansion of two CAMs with varying widths by combining match results from two CAMs and integrating the same. The above technique combines two CAMs to form a wider CAM. The synchronizer circuit further provides the ability to handle timing mismatches between the CAMS, and the ability to differentiate between the combinations of valid states, where both CAMs are enabled or only one of them is enabled.

The above-described technique provides various schemes for width expansion of two CAMs. It is expected that the above-described methods and apparatus can also be implemented for binary CAMs, ternary CAMs (TCAMs), static CAMs, and/or dynamic CAMs.

While the present subject matter has been described with reference to static memory elements, it is anticipated that dynamic memory elements can also be used to store the data bits.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-7 are merely representational and are not drawn to scale. Certain proportions thereof may be exaggerated, while others may be minimized. FIGS. 1-7 illustrate various embodiments of the invention that can be understood and appropriately carried out by those of ordinary skill in the art.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A system of content addressable memories (CAMs) for combining match results of two CAMs, comprising:
   a first CAM device;
   a second CAM device;
   a plurality of global match (ML) lines and dummy match lines and associated outputs of each CAM device coupled to their associated plurality of ML lines and dummy match lines; and
   an External Priority Encoder module comprising:
     an Interface Circuit for each of the first CAM device and the second CAM device; and
     a Priority Encoder block in communicating relationship with each Interface Circuit and wherein the Interface Circuit comprises:
       a synchronizer circuit; and
       a plurality of latches, wherein the synchronizer circuit combines and integrates the match results from the first CAM device and the second CAM device and triggers the operation of the External Priority Encoder module based on the latter arriving signal of the first CAM device and the second CAM device, wherein the plurality of latches coupled via the associated plurality of match lines and dummy match lines is used to clock match latches and the associated outputs to each of the first CAM device and the second CAM device to store associated match signals received from each of the first CAM device and the second CAM device,
     wherein the Priority Encoder block generates a signal HIT ADDRESS which gives a priority address location of a match line ML where both the first CAM device and the second CAM device have a match, and
     wherein the synchronizer circuit has the ability to handle mismatches between the first CAM device and the second CAM device as well as to differentiate valid and invalid combinations between the first CAM device and the second CAM device.

2. The system of claim 1, wherein the Interface circuit comprises a first NOR gate and a second NOR gate, wherein each of the first NOR gate and the second NOR gate receives as inputs a EZ control signal (enable signal) and a MATCH signal to receive the corresponding enable signal and the match output signal, and wherein the outputs of each of the first NOR gate and second NOR gate are coupled to a third NOR gate, the output of which is a signal match input to the Priority Encoder block.

3. The system of claim 1, wherein the synchronizer circuit recognizes the enable states of the first CAM device and the second CAM device and operates based on the match results of either or both of the first CAM and second CAM devices.

4. The synchronizer circuit as in claim 1 wherein the synchronizer circuit can operate in a test mode or a normal mode.

5. The system of claim 1, wherein the CAM includes memory type selected from the group comprising of binary CAM, ternary CAM, and static CAM.

6. A method of width expansion of a CAM system comprising the steps of:
combining a first content addressable memory (CAM) and a second CAM;
communicating with each of the first CAM device and the second CAM device through an associated Interface Circuit and a Priority Encoder block, wherein the Interface Circuit comprises a synchronizer circuit;
triggering an External Priority Encoder module using the synchronizer circuit based on a latter arriving signal of the first CAM device and the second CAM device;
generating a signal HIT ADDRESS which gives a priority address location of a match line where both the first CAM device and the second CAM device have a match,
handling mismatches between the CAMs and differentiating valid and invalid combinations between the CAMs by the synchronizer circuit.

7. The method as in claim 6, wherein, in communicating, the Interface circuit comprises a first NOR gate and a second NOR gate.

8. The method of claim 7, further comprising:
receiving as inputs a EZ1 control signal and a MATCH 1 signal and outputting a first signal by the first NOR gate;
receiving as inputs a EZ2 control signal and a MATCH 2 signal and outputting a second signal by the second NOR gate; and outputting a signal match input by a third NOR device to the Priority Encoder block upon receiving the first signal and the second signal.

9. The method as in claim 6, further comprising: recognizing enable states of individual CAMs and operating based on match results of either or both of the first CAM device and the second CAM device by the synchronizing circuit.

10. The method as in claim 6, further comprising: operating the synchronizer circuit in a test mode or a normal mode.

11. The method as in claim 6, wherein the CAM includes memory type selected from the group comprising of binary CAM, ternary CAM, and static CAM.

* * * * *